United States Patent
Jiang et al.

(10) Patent No.: US 7,993,967 B2
(45) Date of Patent: Aug. 9, 2011

(54) SEMICONDUCTOR PACKAGE FABRICATION METHOD

(75) Inventors: Yih-Jenn Jiang, Taichung (TW);
Han-Ping Pu, Taichung (TW);
Chien-Ping Huang, Taichung (TW);
Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 41 days.

(21) Appl. No.: 12/616,834

(22) Filed: Nov. 12, 2009

(65) Prior Publication Data

US 2010/0052146 A1   Mar. 4, 2010

Related U.S. Application Data

(62) Division of application No. 11/985,662, filed on Nov. 16, 2007, now Pat. No. 7,638,879.

(30) Foreign Application Priority Data

Nov. 17, 2006   (TW) ................................. 95142520 A

(51) Int. Cl.
*H01L 21/44* (2006.01)
*H01L 21/48* (2006.01)
*H01L 21/50* (2006.01)

(52) U.S. Cl. ........ 438/106; 438/108; 438/127; 257/666; 257/678

(58) Field of Classification Search .................. 438/106, 438/108, 127, 612; 257/666, 678, 690, 723, 257/E21.502, E23.142
See application file for complete search history.

(56) References Cited

U.S. PATENT DOCUMENTS

| | | | |
|---|---|---|---|
| 5,830,800 A | 11/1998 | Lin | |
| 6,228,753 B1 * | 5/2001 | Lo et al. | 438/612 |
| 6,555,443 B1 * | 4/2003 | Artmann et al. | 438/458 |
| 6,562,654 B2 * | 5/2003 | Kresge et al. | 438/106 |
| 6,710,260 B1 | 3/2004 | Seki et al. | |
| 6,884,652 B2 | 4/2005 | Huang et al. | |
| 7,485,956 B2 * | 2/2009 | Tuckerman et al. | 257/704 |
| 2005/0029110 A1 | 2/2005 | Tang et al. | |

* cited by examiner

*Primary Examiner* — Phuc T Dang
(74) *Attorney, Agent, or Firm* — Peter F. Corless; Steven M. Jensen; Edwards Angell Palmer & Dodge LLP

(57) ABSTRACT

A semiconductor package and a fabrication method are disclosed. The fabrication method includes applying a sacrificial layer on one surface of a metal carrier, applying an insulation layer on the sacrificial layer, and forming through holes in the sacrificial layer and the insulation layer to expose the metal carrier; forming a conductive metallic layer in each through hole; forming a patterned circuit layer on the insulation layer to be electrically connected to the conductive metallic layer; mounting at least a chip on the insulation layer and electrically connecting the chip to the patterned circuit layer; forming an encapsulant to encapsulate the chip and the patterned circuit layer; and removing the metal carrier and the sacrificial layer to expose the insulation layer and conductive metallic layer to allow the conductive metallic layer to protrude from the insulation layer. In the present invention, the distance between the semiconductor package and the external device is increased, and thermal stress caused by difference between the thermal expansion coefficients is reduced, so as to enhance the reliability of the product.

16 Claims, 5 Drawing Sheets

SEMICONDUCTOR PACKAGE FABRICATION METHOD

CROSS-REFERENCE TO RELATED APPLICATION(S)

This application is a divisional of application U.S. Ser. No. 11/985,662, filed on Nov. 16, 2007, now U.S. Pat. No. 7,638,879.

BACKGROUND OF THE INVENTION

1. Field of the Invention

The present invention generally relates to semiconductor packages and fabrication methods thereof, and more particularly to a non-carrier type semiconductor package and a fabrication method thereof.

2. Description of the Prior Art

Conventionally, a semiconductor package is often formed by using a lead frame as a chip carrier. The leadframe comprises a die pad and a plurality of leads formed around the periphery of the die pad. The lead-frame based semiconductor package is formed by attaching a semiconductor chip to the die pad and electrically connecting the semiconductor chip to the leads via the bonding wires, followed by forming an encapsulant to encapsulate the chip, die pad, bonding wires and the inner portions of the leads.

There are a great variety of lead frame based semiconductor packages, such as quad flat non-leaded (QFN) semiconductor package. The main characteristic feature of this QFN semiconductor package is that, unlike a quad flat package (QFP), it does not have external gull wing shaped leads being formed outside the package for electrically connecting with external devices, therefore, the finished QFN package is substantially smaller. As shown in FIG. 1, the bottom surfaces of both the lead frame die pad 11 and the leads 12 of the QFN semiconductor package 1 are exposed from an encapsulant 15. This allows the semiconductor chip 13, which is mounted on the die pad 11 and electrically connected to the leads 12 via the bonding wires 14, to be electrically connected to an external device, such as printed circuit board 20, through electrically connecting the exposed surface of the leads to the solder pads 100 on the external device via a solder material 16.

In addition, with the increasing demands for light-weighted and low-profiled semiconductor packages, the conventional lead frame based semiconductor package can not meet the demand for a further reduction in package size, therefore the industry has developed a non-carrier type semiconductor package that the overall thickness of the package can be reduced significantly by eliminating the use of a lead frame.

Referring to FIG. 2, a non-carrier type semiconductor package disclosed by U.S. Pat. No. 5,830,800 is illustrated herein. This semiconductor package is formed by first forming a plurality of electroplating solder pads 21 on a copper carrier (not shown in the FIG.) according to the circuit layout design. The plating layer for forming the solder pads 21 is a metal layer consisting of gold/palladium/nickel/palladium (Au/Pd/Ni/Pd) with a thickness of about 6 μm. Then, a chip 22 is mounted on the carrier followed by a wire bonding process to establish electrical connections by using bonding wires 23. After that, an encapsulant 24 is formed by a molding process, and then the copper carrier is removed to expose the electroplating solder pads 21. In such ways, the semiconductor package without a chip carrier is formed, which can be electrically connected to an external device such as a printed circuit board 20 via the solder joints 26, formed to bond the exposed solder pads 21 and the bond pads 200 of the external device via a solder material.

However, when a highly integrated chip, namely, the chip has a high density layout of electronic elements is used in the aforementioned QFN semiconductor package and the non-carrier type semiconductor package, comparatively large numbers of leads or electroplating solder pads for the corresponding electrical connections are required, and as a result, the package size need to increase to accommodate more I/O and then the loop length of the bonding wires and the distance between the chip and the leads or the electroplating solder pads are increased, and consequently, not only increase the difficulties of bonding wire operation, but also easily cause problems such as bonding wire shift and short circuit, thus seriously degrading the quality of electrical connections.

In views of the aforementioned drawbacks, the claim of the U.S. Pat. No. 6,884,652 discloses a semiconductor package that is capable of effectively shortening the bonding wire loop length. As shown in the FIG. 3, the semiconductor package comprises: a dielectric layer 30, wherein, a plurality of through holes 300 are formed at predetermined positions therein; a solder 31, which is applied in each through holes 300 of the dielectric material layer; a first thin copper layer 32, formed on the dielectric material layer 30 and the solder 31; a second copper layer 33, applied on the top of the first thin copper layer 32 allowing a plurality of conductive traces 330 to be formed on the first copper layers 32, and each of the conductive traces 330 has a terminal 331; a metallic layer 34, which is applied on each terminal 331 of the conductive traces 330; at least a chip 35, attached on a predetermined location of the conductive traces 330 by an adhesive; a plurality of bonding wires 36, for electrically connecting the chip 35 to the terminal 331 that has a metallic layer 34 atop; and an encapsulant 37, for encapsulating the chip 35, bonding wires 36 and conductive traces 330, allowing the dielectric material layer 30 and the solder 31 to be exposed from the encapsulant 37.

The advantage of the aforementioned semiconductor package is that it does not require a lead frame or a substrate to function as the chip carrier, and the conductive traces can be flexibly distributed in correspondence to the design of chip and then the terminal 331 with the metallic layer 34 can be much closer to the wire bonding disposing region on the chip, therefore, the loop length of the bonding wire for electrically connecting the chip to the terminal of the conductive trace, consequently can be shortened, thereby, enhancing circuit layout flexibility, electrical connection quality and performance of the semiconductor package.

However, regardless of the aforementioned QFN or non-carrier type semiconductor packages, when the semiconductor package is electrically connected to the printed circuit board by means of the surface mounting technology (SMT) via the reflowed solder forming the solder joints, due to the different materials of the semiconductor package and the printed circuit board, there is a thermal stress formed between the semiconductor package and the printed circuit board. The thermal stress is in direct proportion to the difference between the thermal expansion coefficients of the semiconductor package and the printed circuit board, and in inverse proportion to the height of the solder joint. The thermal stress of solder joint is in direct formulated as $((\alpha_2-\alpha_1)\Delta T\delta_1)/h$, wherein the $(\alpha_2-\alpha_1)$ is the coefficient of thermal expansion difference between the semiconductor package and the printed circuit board, the $\Delta T$ is the maximum temperature difference between the semiconductor package and the printed circuit board, the $\delta_1$ is the distance between the center of the semiconductor package and the location of solder joint, and the h is the height of solder joint. Consequently, in the aforementioned semiconductor package of the prior art, since the solder joint height is very low, the solder joint would suffer a great amount of thermal stress. In this situation, it would not only reduce the fatigue life of the solder joint, but further cause the problem of crack of the solder joint, therefore seriously affecting the reliability of the electronic products. Comparatively, when the height and amount of the solder are increased, the excessive amount of solder or improper control over mounting between the semiconductor package and the printed circuit board would cause neighboring solder to contact each other which would further cause short circuit and bring defects in fabrication.

Hence, it is a highly urgent issue in the industry to provide a non-carrier type semiconductor package and a fabrication method thereof, which can effectively solve the aforementioned drawbacks of the prior arts, such as solder joint crack and poor reliability of the electronic products, as well as increase circuit layout flexibility and shorten the bonding wires loop length.

SUMMARY OF THE INVENTION

In views of the aforementioned and other drawbacks, it is a primary objective of the present invention to provide a non-carrier type semiconductor package and a fabrication method thereof, which is capable of forming bump structures for electrically connecting to external devices.

It is another objective of the present invention to provide a non-carrier type semiconductor package and a fabrication method thereof, which is capable of reducing the thermal stress of a plurality of solder joints that connect the semiconductor package with a printed circuit board, thereby enhancing the reliability of the electronic products.

It is a further objective of the present invention to provide a non-carrier type semiconductor package and a fabrication method thereof, which is capable of avoiding the problem of short circuit caused by the neighboring solder contact due to the improper control over mounting between the semiconductor package and the printed circuit board, thereby preventing defects during fabrication.

It is still another objective of the present invention to provide a semiconductor package and a fabrication method thereof, which is capable of effectively enhancing the semiconductor package circuit layout flexibility and the electrical connection quality.

To achieve the aforementioned and the other objectives, the present invention provides a semiconductor package, comprising: an insulation layer having a first surface, a second surface and a plurality of through holes; a conductive metallic layer formed in each through hole and protruding from the first surface of the insulation layer; a patterned circuit layer formed on the second surface of the insulation layer and electrically connected to the insulation layer; a chip mounted on a predetermined location of the insulation layer and electrically connected to the patterned circuit layer; and an encapsulant encapsulating the chip and the patterned circuit layer.

A fabrication method of the semiconductor package comprises the steps of: applying a sacrificial layer on one surface of a metal carrier, applying an insulation layer on the sacrificial layer, and forming a plurality of through holes at a plurality of predetermined areas of the sacrificial layer and the insulation layer to expose the metal carrier; forming a conductive metallic layer in each through hole; forming a patterned circuit layer on the insulation layer to be electrically connected to the conductive metallic layer; mounting at least a chip on a predetermined position of the insulation layer and electrically connecting the chip to the patterned circuit layer; forming an encapsulant to encapsulate the chip and the patterned circuit layer; and removing the metal carrier and the sacrificial layer to expose the insulation layer and conductive metallic layer, to allow the conductive metallic layer to protrude from the insulation layer.

Therefore, the semiconductor package of the present invention can be electrically connected to an external device, such as a printed circuit board, through bump structure between the conductive metallic layers of the semiconductor package and the printed circuit board with an increased distance between the semiconductor package and the printed circuit board, as well as reduced thermal stress caused by a difference between the thermal expansion coefficients of the semiconductor package and the printed circuit board. As a result, the reliability of the electronic product can be enhanced without increasing the solder amount for electrical connection, and the problem of short circuit caused by a contact between neighboring bonding wire due to increased solder amount can be avoided.

Furthermore, the semiconductor package of the present invention does not need a chip carrier (such as a prepared lead frame or substrate), so as to lower the production cost and meet the demands for light-weighted and low profiled electronic products. The patterned circuit layer formed in the semiconductor package can be flexibly laid out in corresponding to the degree of chip integration and be positioned closer to the region where an electrical connection with the chip occurs, so as to shorten the loop length of the bonding wire that electrically connects the chip to the patterned circuit layer, and to shorten the electrical connection path, thereby enhancing the circuit layout flexibility and electrical connection quality of the semiconductor package.

BRIEF DESCRIPTION OF DRAWINGS

The present invention can be more fully understood by reading the following detailed description of the preferred embodiments, with reference made to the accompanying drawings, wherein:

FIG. 4D' is a schematic diagram showing the formation of an encapsulation layer on a patterned circuit layer according to the practical requirements in the present invention.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

First Preferred Embodiment

FIGS. 4A-4G are cross-sectional views showing a semiconductor package and a fabrication method thereof according to the first preferred embodiment of the present invention.

Figure 1:
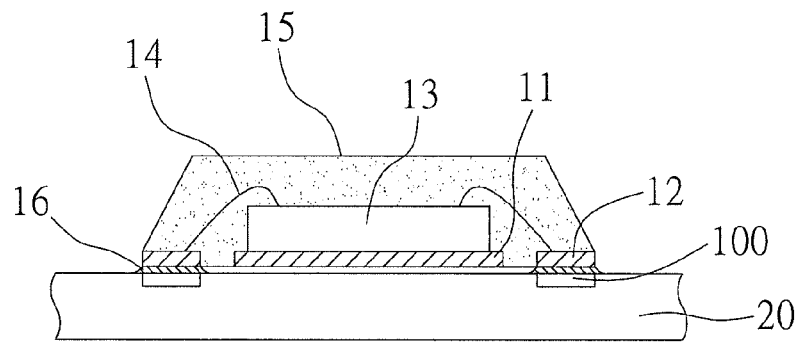
FIG. 1 is a cross-sectional view of a conventional quad flat non-leaded (QFN) semiconductor package.
Figure 2:
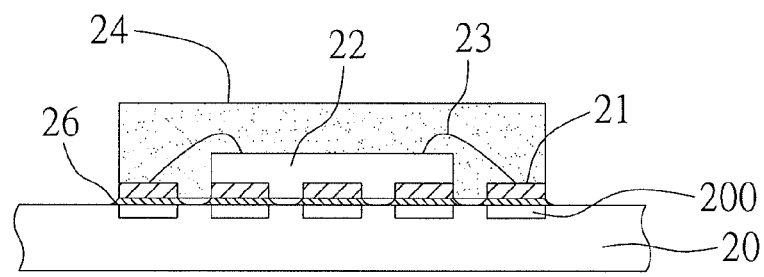
FIG. 2 is a cross-sectional view of a non-carrier typed semiconductor package disclosed in U.S. Pat. No. 5,830,800.
Figure 3:
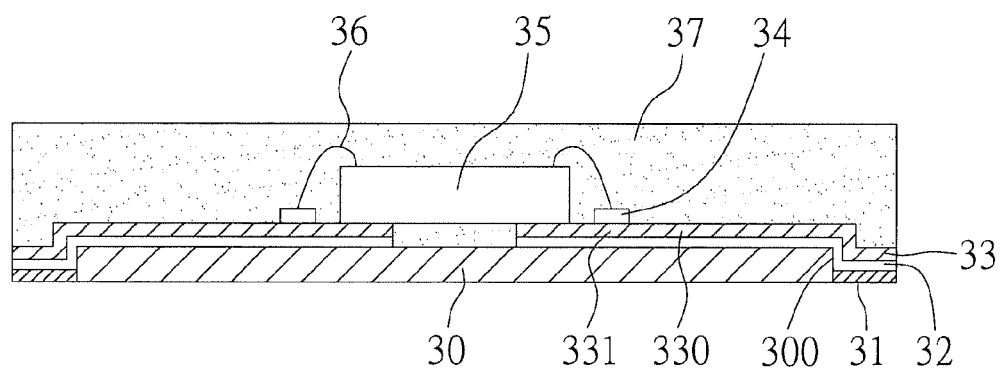
FIG. 3 is a cross-sectional view of a non-carrier typed semiconductor package disclosed in U.S. Pat. No. 6,884,652.
Figure 4A:
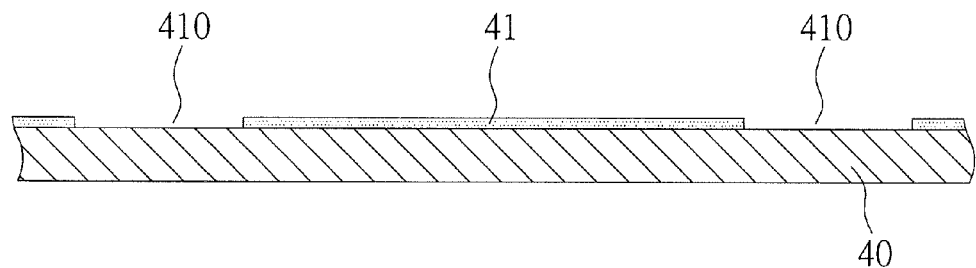
FIGS. 4A to 4G are schematic diagrams showing a semiconductor package and a fabrication method thereof according to the first embodiment of the present invention.

As shown in FIG. 4A, a metal carrier 40, e.g. a copper (Cu) plate is prepared, and then a sacrificial layer 41 is applied on a surface of the metal carrier. The sacrificial layer 41 is made of, for example, polymeric material, such as epoxy resin, photo-resist, etc., and its thickness is about 10 to 30 μm. The sacrificial layer 41 has a plurality of through holes 410, formed by means of traditional photolithography, or stencil printing method.

Figure 4B:
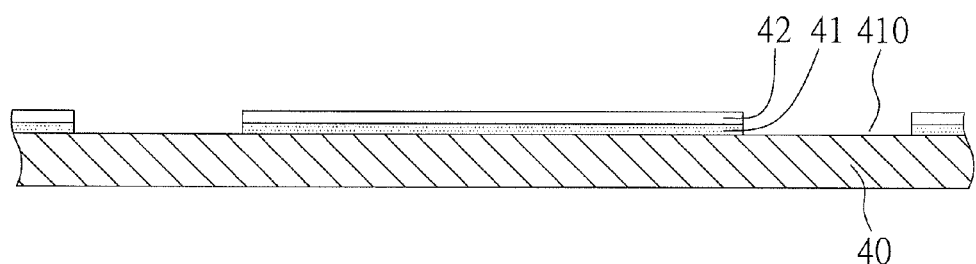

As shown in the FIG. 4B, an insulation layer 42 is applied on the sacrificial layer 41. The insulation layer 42 is, for example, a solder mask, and is treated by photolithography to expose the through holes 410 of the sacrificial layer 41 and to further expose the metal carrier 40. Alternatively, a laser perforation process is performed on the sacrificial layer 41 and the insulation layer 42 to form the plurality of through holes, so as to expose the metal carrier 40.

Figure 4C:
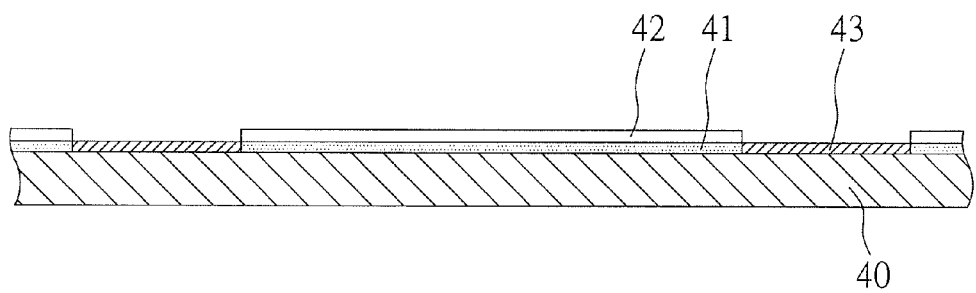

As shown in the FIG. 4C, a conductive metallic layer 43 is formed in each of the plurality of through holes 410 by means of electroplating method. The conductive metallic layer is, for example, a nickel/gold (Ni/Au) layer. The conductive metallic layers 43 provide a means for electrically connecting the finished semiconductor package to an external device.

Figure 4D:
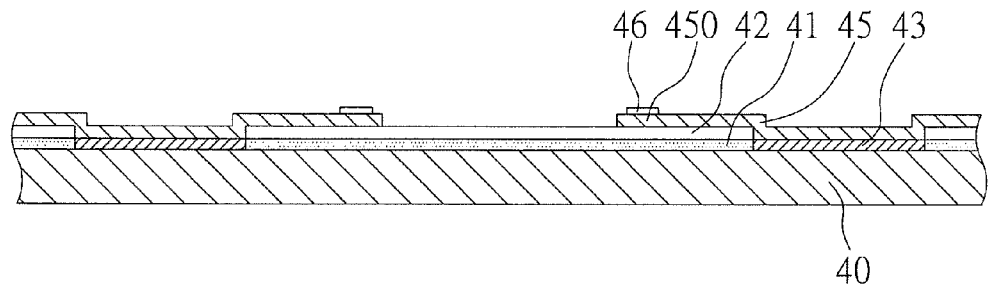
Figure 4D:
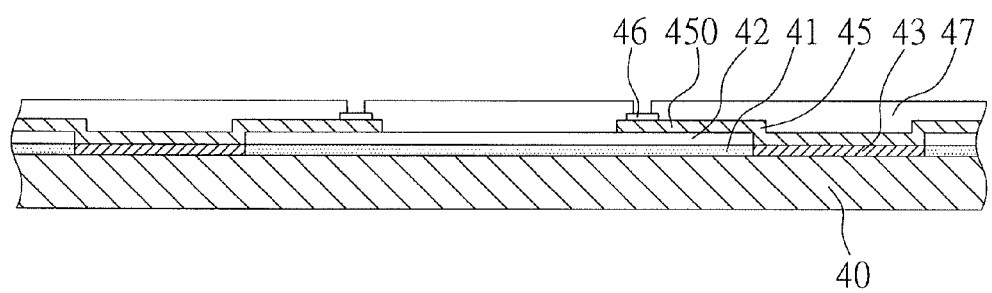

As shown in the FIG. 4D, a patterned circuit layer 45 is formed on the insulation layer 42 and is electrically connected to the conductive metallic layers 43. The patterned circuit layer 45 is formed by forming a thin copper layer on the insulation layer 42 by electroless plating, sputtering or other methods, and then forming a thick copper layer on the thin copper layer by electroplating, followed by a series of processes including photo-resist coating, exposing, developing and etching and removing the photo-resist, so that the patterned circuit layer 45 is formed on the thin copper layer. The patterned circuit layer 45 has a plurality of terminals 450, which subsequently provide a means for electrical connections to a semiconductor chip. In addition, a metallic layer 46 can be further formed on each of the terminals 450 of the patterned circuit layer 45 by electroplating, in which the metallic layer 46 is made of silver (Ag) or nickel/gold (Ni/Au).

In addition, referring to the FIG. 4D', depending on practical requirements, an covering layer 47 can be selectively formed on the patterned circuit layer 45, allowing each of the plurality of terminals 450 of the patterned circuit layer 45 or the metallic layer 46 to be exposed from the covering layer 47. The covering layer is made of, for example, solder mask or ajinomoto build-up film (ABF).

Figure 4E:
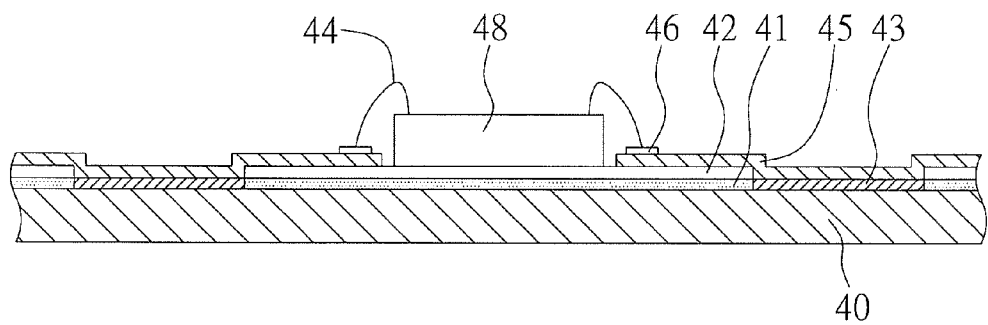

As shown in the FIG. 4E, at least a chip 48 is mounted on a predetermined position of the insulation layer 42. Then, a plurality of bonding wires 44 are formed by a wire bonding process for electrically connecting the chip 48 to the metallic layers 46 on the terminals of the patterned circuit layer.

Figure 4F:
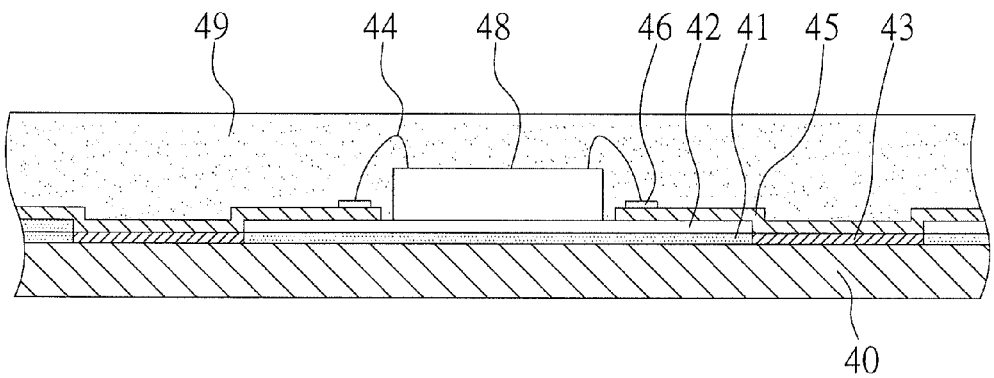

As shown in the FIG. 4F, a molding process is performed to form an encapsulant 49 that encapsulates the chip 48, the plurality of bonding wires 44, and the patterned circuit layer 45, thereby preventing the elements encapsulated by the encapsulant 49 from damages caused by external moisture or any pollutant.

Figure 4G:
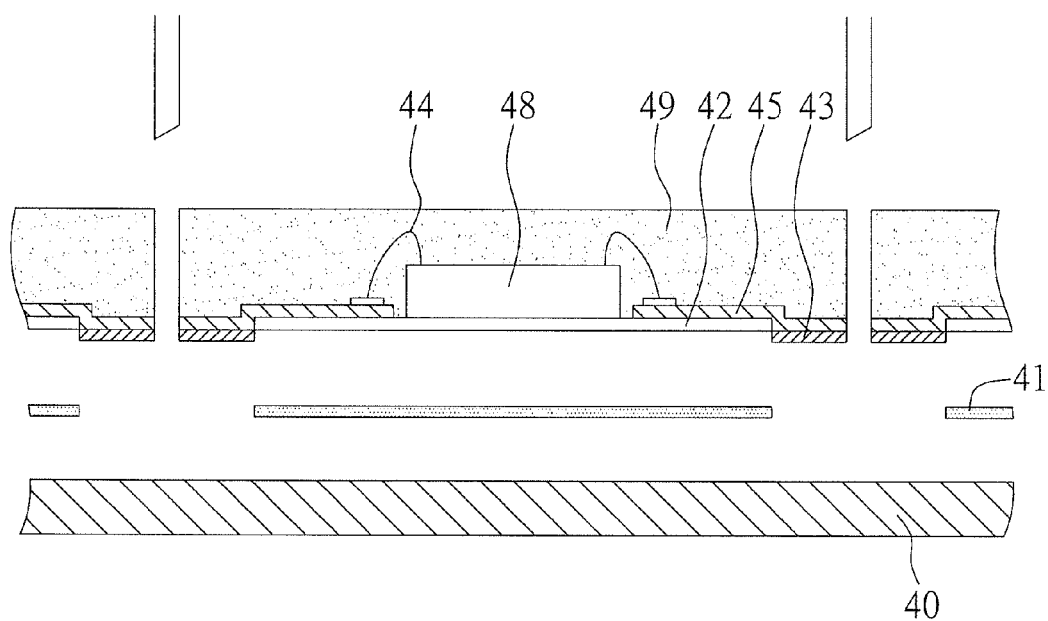

As shown in the FIG. 4G, a cutting process is performed according to a predetermined plane size of the semiconductor package, to remove the metal carrier 40 and the sacrificial layer 41 by etching in order to expose the insulation layer 42 and the conductive metallic layers 43, such that the conductive metallic layers 43 protrude from the insulation layer 42 about 10 to 30 μm (that is the thickness of the aforementioned sacrificial layer 41) in height, and then the fabrication of the non-carrier typed semiconductor package of the present invention is completed. The protruding conductive metallic layers 43 provides an increased distance between the semiconductor package and the external device, for example a printed circuit board, consequently, the thermal stress caused by the difference between the thermal expansion coefficients of the semiconductor package and the external device is reduced, and as a result the reliability of the products can be desirably enhanced. In addition, it is also applicable to remove the metal carrier 40 and the sacrificial layer 41 by etching, followed by the cutting process to complete the fabrication process of the non-carrier typed semiconductor package according to the present invention.

By the aforementioned fabrication method, the present invention further discloses a semiconductor package including: an insulation layer 42 having a plurality of through holes, a first surface and a second surface; a conductive metallic layer 43 formed in each through hole and protruding from the first surface of the insulation layer 42; a patterned circuit layer 45 formed on the second surface of the insulation layer 42 and electrically connected to the conductive metallic layers 43; a chip 48 mounted on a predetermined position of the insulation layer 42 and electrically connected to the patterned circuit layer 45; and an encapsulant 49 encapsulating the chip 48 and the patterned circuit layer 45.

The Second Embodiment

Figure 5A:
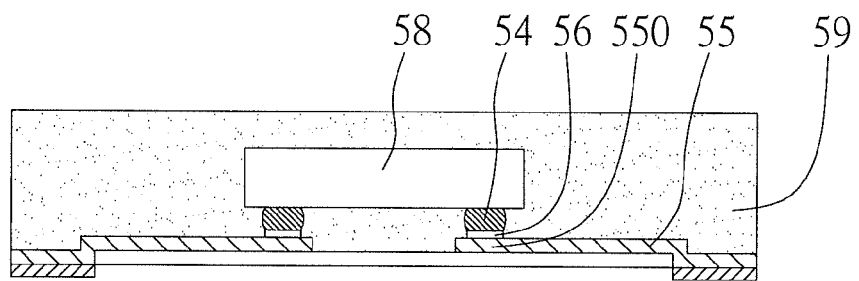
FIGS. 5A and 5B are cross-sectional views of a semiconductor package according to the second embodiment of the present invention.
Figure 5B:
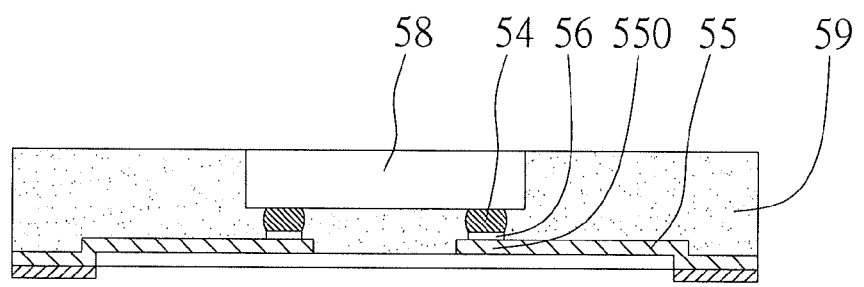

FIG. 5A and FIG. 5B are cross-sectional views illustrating a semiconductor package according to a second preferred embodiment of the present invention. As shown in FIG. 5A, the semiconductor package of the present embodiment is substantially similar to the one in the first embodiment, with only the major difference being that the chip 58 of the present embodiment is mounted on the patterned circuit layer 55 by means of flip-chip. More specifically, in the chip mounting process, the active surface of the chip 58 is facing towards the patterned circuit layer 55 to be electrically connected to the plurality of terminals 550 of the patterned circuit layer 55 or the metallic layers 56 formed on the terminals 550 via a plurality of solder bumps 54. Then, an encapsulant 59 for encapsulating the chip 58 is formed. Compared with the bonding wires that connect the chip and the patterned circuit layer, the flip-chip technology using solder bumps further shortens the electrical connection path between the chip and the patterned circuit layer, and thus it is more capable of ensuring a high quality of the electrical connection between the chip and the patterned circuit layer.

In addition, as shown in the FIG. 5B, it is also applicable to make the inactive surface of the chip 58 exposed from the encapsulant 59 encapsulating the chip 58, so as to allow the heat produced from the chip during operation to be effectively dissipated via the exposed inactive surface of the chip 58, thereby, enhancing the heat dissipation efficiency.

Hence, the present invention provides a sacrificial layer between the metal carrier and the insulation layer with a plurality of through holes at a plurality of predetermined locations of the sacrificial layer and the insulation layer; forming a conductive metallic layer in each through hole and a patterned circuit layer on the insulation layer, allowing the patterned circuit layer to be electrically connected to the conductive metallic layer; mounting and electrically connecting at least a chip to the patterned circuit layer; forming an encapsulant to encapsulate the chip and the patterned circuit layer; and removing the metal carrier and the sacrificial layer to allow the conductive metallic layers to protrude from the insulation layer. In such ways, the finished semiconductor package can be electrically connected to an external device, such as a printed circuit board, through bump structures between the conductive metallic layers of the semiconductor package and the printed circuit board with an increased distance between the semiconductor package and the printed circuit board, as well as reduced thermal stress caused by a difference between the thermal expansion coefficients of the semiconductor package and the printed circuit board. As a result, the reliability of the electronic product can be enhanced without increasing the solder amount for electrical connection, and the problem of short circuit caused by a contact between neighboring bonding wire due to increased solder amount can be avoided.

Furthermore, the semiconductor package of the present invention does not need a chip carrier (such as a prepared lead frame or substrate), so as to lower the production cost and meet the demands for light-weighted and low profiled electronic products. The patterned circuit layer formed in the semiconductor package can be flexibly laid out in corresponding to the degree of chip integration and be positioned closer to the region where an electrical connection with the chip occurs, so as to shorten the loop length of the bonding wire that electrically connects the chip to the patterned circuit layer and to shorten the electrical connection path, thereby enhancing the circuit layout flexibility and electrical connection quality of the semiconductor package.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package fabrication method, comprising the steps of:
    applying a sacrificial layer on a surface of a metal carrier, applying an insulation layer on the sacrificial layer, and forming a plurality of through holes at a plurality of predetermined areas of the sacrificial layer and the insulation layer to expose the metal carrier;
    forming a conductive metallic layer in the through holes;
    forming a patterned circuit layer on the insulation layer to be electrically connected to the conductive metallic layer;
    mounting at least a chip on a predetermined position of the insulation layer and electrically connecting the chip to the patterned circuit layer;
    forming an encapsulant to encapsulate the chip and the patterned circuit layer; and
    removing the metal carrier and the sacrificial layer to expose the insulation layer and the conductive metallic layer, to allow the conductive metallic layer to protrude from the insulation layer.

2. The semiconductor package fabrication method of claim 1, wherein the sacrificial layer is made of a polymeric material.

3. The semiconductor package fabrication method of claim 2, wherein the sacrificial layer is one of an epoxy and a photo-resistant, and has a thickness of about 10 μm to 30 μm.

4. The semiconductor package fabrication method of claim 1, wherein the insulation layer is a solder mask layer.

5. The semiconductor package fabrication method of claim 1, wherein the conductive metallic layer is a nickel/gold (Ni/Au) layer as an electrical connection to an external device.

6. The semiconductor package fabrication method of claim 1, wherein the patterned circuit layer is formed by the steps of: forming a thin copper layer on the insulation layer by electroless plating or sputtering; and forming a thick copper layer on the thin copper layer by electroplating, and then performing lithography process and etching process to form the patterned circuit layer.

7. The semiconductor package fabrication method of claim 1, further comprising forming a metallic layer on a plurality of terminals of the patterned circuit layer for forming electrical connections with the chip.

8. The semiconductor package fabrication method of claim 7, wherein the metallic layer is one of a silver (Ag) layer and a nickel/gold (Ni/Au) layer.

9. The semiconductor package fabrication method of claim 7, further comprising forming a covering layer on the patterned circuit layer, allowing the plurality of terminals of the patterned circuit layer or the metallic layers to be exposed from the covering layer.

10. The semiconductor package fabrication method of claim 9, wherein the covering layer is one of a solder mask and an ajinomoto build-up film (ABF).

11. The semiconductor package fabrication method of claim 1, wherein the chip is electrically connected to the patterned circuit layer by wire bonding or flip chip method.

12. The semiconductor package fabrication method of claim 1, further comprising performing a cutting process according to a predetermined plane size of the semiconductor package.

13. The semiconductor package fabrication method of claim 1, wherein the chip has an active surface and an inactive surface, the active surface is electrically connected to the patterned circuit layer by flip chip method, and the inactive surface is exposed from the encapsulant.

14. The semiconductor package fabrication method of claim 1, wherein after applying the sacrificial layer and the insulation layer, a laser perforation process is performed to form the plurality of through holes.

15. The semiconductor package fabrication method of claim 1, wherein the through holes of the sacrificial layer are formed by means of photolithography method or stencil printing method.

16. The semiconductor package fabrication method of claim 1, wherein the insulation layer is treated by photolithography processes to form the through holes of the sacrificial layer, so as to expose the metal carrier.

* * * * *